(12) United States Patent
Weyers et al.

(10) Patent No.: US 9,640,602 B2
(45) Date of Patent: May 2, 2017

(54) SEMICONDUCTOR DEVICE INCLUDING MAGNETICALLY COUPLED MONOLITHIC INTEGRATED COILS

(71) Applicant: Infineon Technologies Austria AG, Villach (AT)

(72) Inventors: Joachim Weyers, Hoehenkirchen-Siegertsbrunn (DE); Kevni Bueyuektas, Munich (DE); Franz Hirler, Isen (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 634 days.

(21) Appl. No.: 13/655,630

(22) Filed: Oct. 19, 2012

(65) Prior Publication Data
US 2014/0110822 A1    Apr. 24, 2014

(51) Int. Cl.
| H01L 49/02 | (2006.01) |
| H01L 25/00 | (2006.01) |
| H01L 23/64 | (2006.01) |
| H01F 17/00 | (2006.01) |

(52) U.S. Cl.
CPC ......... *H01L 28/10* (2013.01); *H01F 17/0033* (2013.01); *H01L 23/645* (2013.01); *H01L 25/00* (2013.01); *H01L 2924/0002* (2013.01)

(58) Field of Classification Search
CPC . H01F 38/14; H01F 41/02; H01F 6/06; H01F 7/064; H01H 47/22; H01H 50/16
USPC .................................................. 257/531, 295
See application file for complete search history.

(56) References Cited

U.S. PATENT DOCUMENTS

| 6,148,500 A   * | 11/2000 | Krone ................. H01F 17/0033 29/602.1 |
| 8,072,042 B1   | 12/2011 | Kroener |
| 2003/0002210 A1* | 1/2003 | Inaguma ....................... 360/123 |
| 2005/0052268 A1* | 3/2005 | Pleskach ............. H01F 17/0033 336/200 |
| 2007/0139976 A1* | 6/2007 | deRochemont ........ B82Y 30/00 363/17 |
| 2009/0140383 A1* | 6/2009 | Chang et al. ................. 257/531 |
| 2011/0073987 A1* | 3/2011 | Mackh .............. H01L 21/76898 257/531 |

(Continued)

FOREIGN PATENT DOCUMENTS

| CN | 1466679 A | 1/2004 |
| CN | 102237336 A | 11/2011 |

*Primary Examiner* — Marc Armand
*Assistant Examiner* — Quinton Brasfield
(74) *Attorney, Agent, or Firm* — Murphy, Bilak & Homiller, PLLC

(57) ABSTRACT

A semiconductor device includes a first coil that is monolithically integrated in a first portion of a semiconductor body and that includes a first winding wrapping around a first core structure. A second coil is monolithically integrated in a second portion of the semiconductor body and includes a second winding wrapping around the second core structure. The first and second coils are magnetically coupled with each other. An insulator frame in the semiconductor body surrounds the first portion and excludes the second portion. High dielectric strength between the first and the second coils is achieved without patterning a backside metallization for connecting the turns of the windings and without being restricted to thin substrates.

27 Claims, 6 Drawing Sheets

(56) References Cited

U.S. PATENT DOCUMENTS

2011/0248380 A1* 10/2011 Yoshihara .............. H01F 5/003
                                                    257/531
2012/0098729 A1*  4/2012 Kato .................... G08B 13/00
                                                    343/856

* cited by examiner

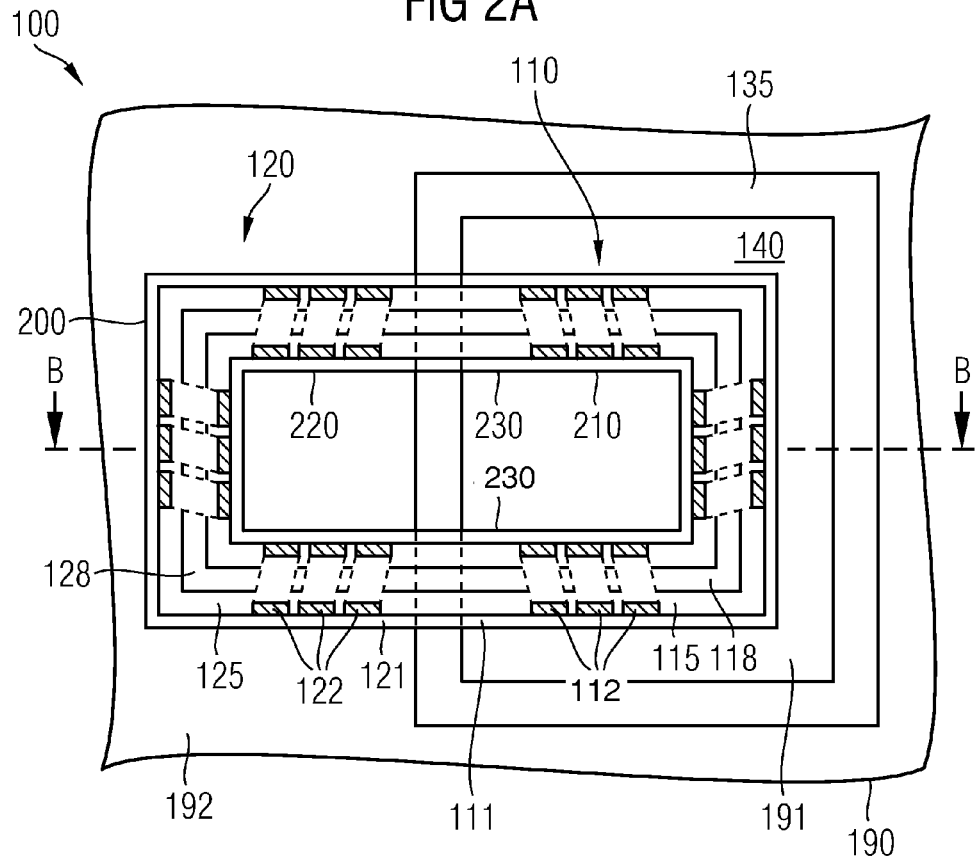
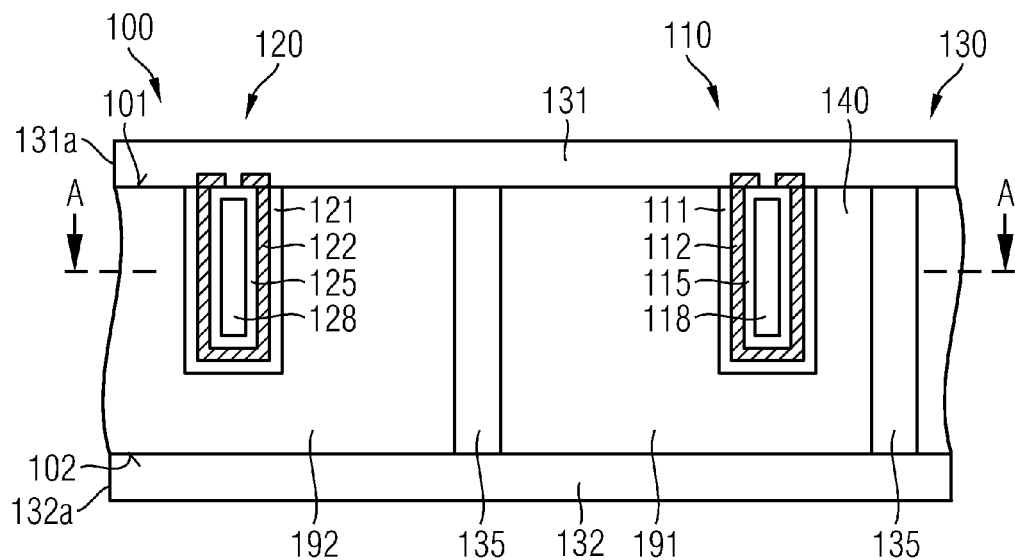

SEMICONDUCTOR DEVICE INCLUDING MAGNETICALLY COUPLED MONOLITHIC INTEGRATED COILS

TECHNICAL FIELD

The present application relates generally to semiconductors, and particularly relates to monolithic integrated inductors.

BACKGROUND

Magnetically coupled coils or inductors are used for galvanic decoupling of signals, on-chip current measurements and power converters, by way of example. It is desirable to further improve monolithic integrated inductors.

SUMMARY

According to an embodiment, a semiconductor device includes a first coil that is monolithically integrated in a first portion of a semiconductor body and that includes a first winding. A second coil is monolithically integrated in a second portion of the semiconductor body and includes a second winding. The first and second coils are magnetically coupled with each other. An insulator frame in the semiconductor body surrounds the first portion in lateral directions parallel to a main surface of the semiconductor body, and excludes the second portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and, together with the description, serve to explain principles of the invention. Other embodiments of the invention and intended advantages will be readily appreciated as they become better understood by reference to the following detailed description.

FIG. 2A is a schematic cross-sectional view parallel to a main surface of a portion of a semiconductor device, including two magnetically coupled coils according to an embodiment providing a continuous coil structure.

FIG. 2B is another schematic cross-sectional view of the portion of the semiconductor device along line B-B in FIG. 2A.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

Figure 1A:
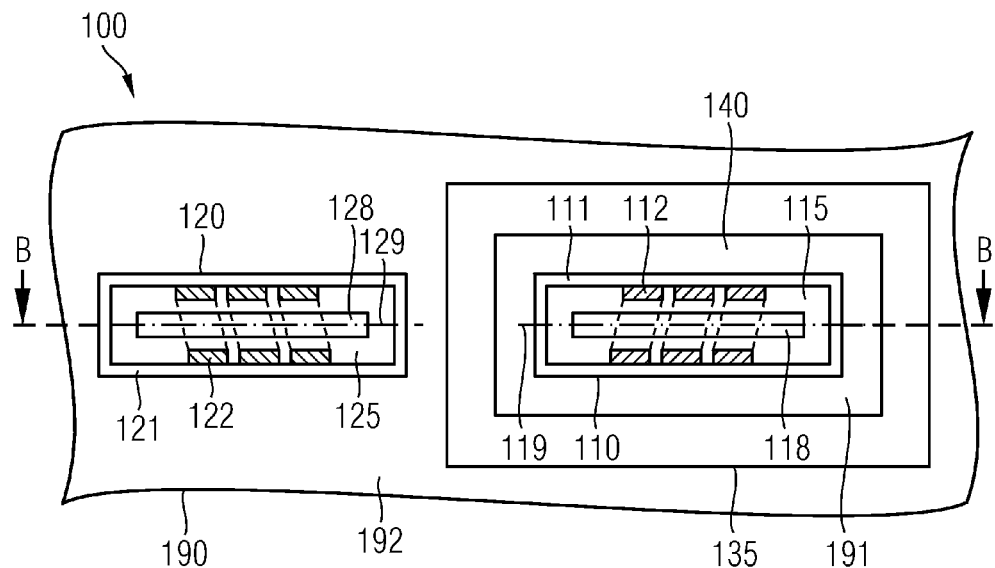
FIG. 1A is a schematic cross-sectional view parallel to a main surface of a semiconductor device, including two magnetically coupled coils according to an embodiment providing linear core structures.
Figure 1B:
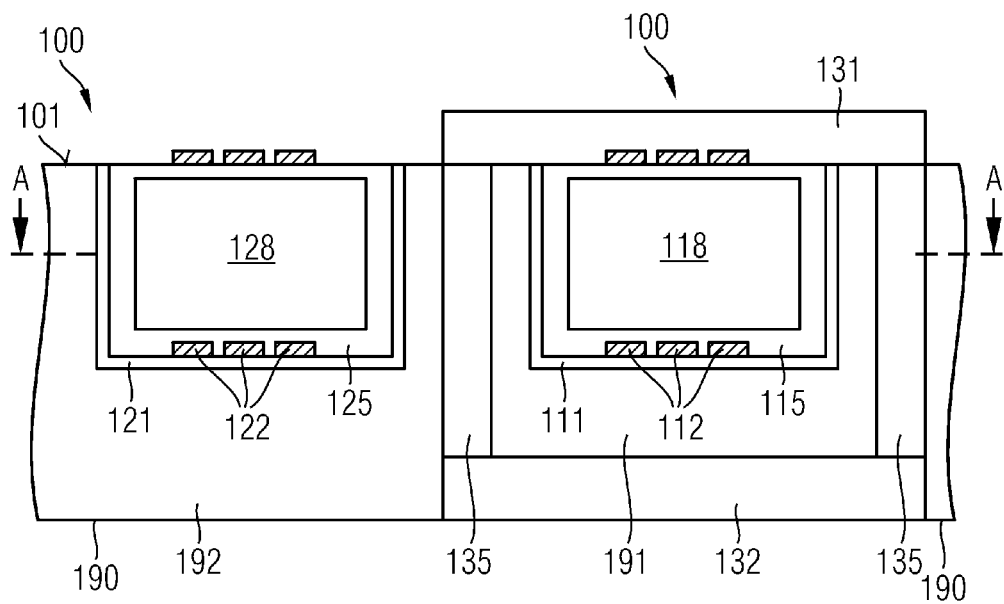
FIG. 1B is another schematic cross-sectional view of the portion of the semiconductor device along line B-B in FIG. 1A.

FIGS. 1A to 1B refer to a semiconductor device 100 including a semiconductor body 190 with a main surface 101. The semiconductor body 190 is provided from a monocrystalline semiconductor material, for example Silicon (Si), Silicon Carbide (SiC), Germanium (Ge), a Silicon Germanium crystal (SiGe), Gallium Nitride (GaN), Gallium Arsenide (GaAs), Gallium Phosphide (GaP), Indium Phosphide (InP), or Indium Arsenide (InAs). Outside the illustrated portion, the semiconductor body 190 may include further conductive, insulating or semiconducting structures, such as, for example, doped zones, shallow trench insulator structures, semiconductor elements, logic circuits, driver circuits, wiring lines and contact pads. The normal to the main surface 101 defines a vertical direction and lateral directions are directions parallel to the main surface 101.

A first coil 110 with a first winding 112 is monolithically integrated in a first portion 191 of the semiconductor body 190. The first portion 191 may have a circular, ellipsoid or polygonal shape, for example a rectangular shape. The first coil 110 may be formed in a cavity that extends from a main surface 101 into the semiconductor body 190. A coil insulator structure 111 lines the cavity and covers an inner surface including the sidewalls and the bottom of the cavity. The coil insulator structure 111 may include one or more layers, for example a dielectric layer electrically insulating the first coil 110 from the semiconductor body 190. The dielectric layer may include sub-layers of one or more insulator materials, for example an oxide or nitride of a constituent of a semiconductor material forming the semiconductor body 190. In the case of a silicon semiconductor body 190, for instance, the dielectric layer may include sub-layers of silicon oxide, silicon nitride or silicon oxynitride, for example. The coil insulator layer 111 may include a barrier layer being effective as a diffusion barrier and hampering the diffusion of atoms from the first winding 112 into the semiconductor body 190. The barrier layer may include one or more sub-layers from silicon nitride, e.g., SiN or Si3N4, or TiW.

The first winding 112 may include at least two vertical sections extending in a direction having a component parallel to the vertical direction. According to an embodiment, tapering vertical sections are formed along sidewalls of a V-shaped cavity extending from the main surface 101 into the semiconductor body 190, wherein a comparatively simply etch process may be used to form the cavity. According to another embodiment, the vertical sections are approximately parallel to the vertical direction. The first winding 112 may include at least one bottom section extending approximately parallel to the main surface 101.

The vertical sections are arranged in two lines running parallel to the main surface 101. The bottom sections run parallel to the main surface 101. Each bottom section connects two vertical sections arranged along different lines along an edge distant to the main surface 101. According to an embodiment the first winding 112 further includes at least one top section running in a plane parallel to the main surface 101 and connecting two vertical sections arranged along different lines along an edge oriented to the main surface 101 to form one or more turns.

The first winding 112 may include one or more sub-layers containing a doped semiconductor material, e.g., polycrystalline silicon, or a metal, such as copper (Cu), aluminum (Al), nickel (Ni), titanium (Ti), silver (Ag), gold (Au), platinum (Pt), and/or palladium (Pd) or tungsten (W) as a main constituent or as the only constituent. The one or more sub-layers may include metal silicides, metal nitrides, conductive metal oxides or metal alloys.

Connection leads (not illustrated) may electrically connect the first winding 112 with further conductive portions within the first portion 191, for example semiconductor elements, logic circuits, driver circuits, sensor circuits or contact pads.

The first winding 112 wraps around a first core structure. The first core structure includes portions of a core insulator structure 115, wherein further portions of the core insulator structure 115 may electrically insulate neighboring turns of the first winding 112 against each other. The first core structure may be exclusively formed from portions of the core insulator structure 115. According to another embodiment, the first core structure includes a void surrounded by portions of the core insulator structure 115. According to a further embodiment, the first core structure includes a core consisting of or including a diamagnetic material, a ferromagnetic material, a paramagnetic material, or a ferrimagnetic material. The core material(s) may be selected to achieve both a high degree of magnetic coupling between the first and second windings and a reliable dielectric isolation between the first and second windings even at high potential differences. According to an embodiment, the core is formed by ferrite particles embedded in a resin mould to achieve both effects. If the application provides high frequency signals to be applied to the first winding 112, a core may be absent and the first winding 112 wraps around a core structure formed by the core insulator structure 115 or including a void.

The core insulator structure 115 may include one or more sub-layers, wherein each sub-layer may consist of or contain silicon oxide, for example a silicon oxide using TEOS (tetraethylorthosilane) as precursor material, silicon oxynitride, silicon nitride, BSG (boron silicate glass), PSG (phosphorus silicate glass), BPSG (boron phosphorus silicate glass), an epoxy resin or a dielectric polymer like polyimide, benzocyclobutene, polynorbornene, polystyrene, polycarbonate, or parylene, without any additives or containing one or more additives. According to an embodiment, the coil insulator structure 115 fills the interior of the first winding 112 completely.

According to the illustrated embodiment, the core insulator structure 115 separates the first winding 112 from a core 118. The core 118 consists of or contains a magnetic, diamagnetic, paramagnetic, ferromagnetic, or ferrimagnetic material. The core 118 may have a layered structure with a sequence of magnetic, ferromagnetic or ferrimagnetic layers, which are electrically insulated from each other by intermediate dielectric layers. According to an embodiment, the core 118 includes a plurality of layers, each layer consisting of or containing nickel (Ni), iron (Fe), or a nickel iron alloy (NiFe). According to another embodiment, the core 118 contains a ferro- or ferrimagnetic metal powder embedded in a dielectric polymer or plastic material.

A second coil 120 with a second winding 122 wrapping around a second core structure is monolithically integrated in a second portion 192 of the semiconductor body 190. The second coil 120 includes a coil insulator structure 121 electrically insulating the second winding 122 from the surrounding semiconductor body 190. The coil insulator structures 111, 121 of the first and second coils 110, 120 may be provided with the same structure and from the same materials. The second winding 122 may have one or more turns. The structure and materials of the second winding 122 may be the same as those of the first winding 112. The second winding 122 may have the same number of turns as the first winding 112, or may have more or less turns than the first winding 112. Portions of a core insulator structure 125 electrically insulate neighboring turns of the second winding 122. Further portions of the core insulator structure 125 may fill the interior of the second winding 122 completely or may leave a void. According to the illustrated embodiment, the core insulator structure 125 electrically insulates the second winding 122 from a core 128. The cores 118, 128 on the one hand and the core insulator structures 115, 125 of the first and second coils 110, 120 on the other hand may have the same structure and may be provided from the same materials, respectively.

The first and the second coils 110, 120 may be arranged such that a longitudinal axis 119 of the first coil 110 parallel to the main surface 101 coincides with a longitudinal axis 129 of the second coil 120 such that the first and second coils 110, 120 are spatially adjusted to each other.

An insulator frame 135 is formed in the semiconductor body 190, surrounds the first portion 191 of the semiconductor body 190 with the first coil 110 in the lateral directions and excludes the second portion 192 with the second coil 120. The insulator frame 135 passes completely around each cross-section of the first portion 191 in a plane parallel to the main surface 101. The insulator frame 135 may have a uniform structure across the complete perimeter. According to another embodiment, the insulator frame 135 includes at least one intermediate portion of a continuous common coil structure shared by the first and second coils 110, 120. Outside the intermediate portions, the cross-sectional shape of the insulator frame 135 may vary. According to an embodiment, the insulator frame 135 may have a uniform cross-sectional shape, uniform width and a uniform extension in a direction perpendicular to the main surface 101. The extension of the insulator frame 135 perpendicular to the main surface is greater than an extension of the first coil 110 including the coil insulator structure 111.

The insulator frame 135 may be a one-part frame that may be formed in a cavity extending from the main surface 101 into the semiconductor body 190. The insulator frame 135 may be provided from one or more sub-layers of thermal or deposited insulator materials, for example silicon oxide, silicon oxynitride, silicon nitride, BSG, PSG, BPSG, epoxy resin or dielectric polymers like polyimide, benzocyclobutene, polynorbornene, polystyrene, polycarbonate, or parylene, without any additives or containing one or more additives. Another embodiment may provide the insulator frame 135 with dielectric layers enclosing a void or a fill portion including polycrystalline silicon. According to an embodiment, the insulator frame 135 includes a layer or structure containing or consisting of silicon carbide (SiC). Since SiC has a similar thermal expansion coefficient as crystalline silicon, thermo-mechanical stress remains low even for wide insulator frames. According to another embodiment, the insulator frame 135 includes a layer or structure containing or consisting of diamond-like carbon provided by chemical vapor deposition (CVD diamond). Diamond-like carbon has a thermal conductivity such that the insulator frame 135 contributes to dissipating thermal dissipation energy of the coil/transformer.

A vertical extension of the insulator frame 135 with reference to the main surface 101 may be up to 100 micrometers, for example 50 micrometers. The width of the insulator frame 135 may be between 0.1 and 50 micrometer, for example about 10 μm. The insulator frame 135 may surround a rectangular area from about 25 μm$^2$ to 10$^5$ μm$^2$, e.g., from 5 μm×5 μm to 5 μm×1000 μm or from 100 μm×100 μm to 100 μm×1000 μm, by way of example.

The insulator frame 135 provides an improved dielectric insulation between the two coils 110, 120. Other than conventional approaches aiming at increasing the dielectric insulation by increasing the width of the coil insulator structures 111, 121, the present embodiments allow higher critical electrical field strength to be realized. For example, the thickness of coil insulator structures 111, 121 provided exclusively from a thermal oxide is limited to some few micrometers, since with increasing thickness of the grown layer less silicon for forming the silicon oxide is available. Providing thick coil insulator structures 111, 121 from a deposited layer, on the other hand, increases process complexity significantly, since comparatively wide cavities have to be filled with high reliable insulator materials.

The magnetically coupled first and second coils 110, 120 may form the primary and secondary windings of a transformer. The insulator frame 135 formed between the first and second coils 110, 120 has a magnetic susceptibility of about 1. Components of the magnetic induction B which are oriented normal to the surface of the interfaces of the frame insulator 135 are identical. A magnetic induction B between the areas assigned to the first and second coils 110, 120 is not hampered, such that the insulator frame 135 does not magnetically decouple the first and second coils 110, 120. The insulator frame 135 can be considered to be equivalent to an air gap in a transformer core.

According to an embodiment, the frame insulator 135 is provided with a void compensating for mechanical stress occurring during processing of the semiconductor device 100 in a wafer composite. Further the voids compensate for deformations and hence reduce the mechanical stress in the semiconductor device 100 resulting from thick frame insulators 135 based on silicon oxide or other mechanical rigid dielectric materials. Another embodiment provides the insulator frame 135 from an oxide deposited at a low temperature.

A first insulator plate 131, which extends over an area assigned to the first portion 191 of the semiconductor body 190, is provided at a first side of the first coil 110 oriented to the main surface 101. The first insulator plate 131 may be structurally connected with the insulator frame 135. A second insulator plate 132 may extend over the area assigned to the first portion 191 of the semiconductor body 190 at the second side of the first coil 110, wherein the second side is opposite to the first side. According to an embodiment, the second insulator plate 132 is structurally connected with the insulator frame 135.

Each of the first and second insulator plates 131, 132 may be provided from one or more sub-layers of thermal or deposited insulator materials, for example silicon oxide, silicon oxynitride, silicon nitride, BSG, PSG, BPSG, epoxy resin or dielectric polymers like polyimide, benzocyclobutene, polynorbornene, polystyrene, polycarbonate, or parylene without any additives or containing one or more additives.

According to another embodiment the vertical portions of the windings are not connected via top sections such that the "turns" are U-shaped plates. In this case, a ferro- or ferrimagnetic material forming the cores 118, 128 can be provided only after formation of metallic structures and their electrical isolation 115, 125 such that the temperature budget for the core material is significantly reduced. For example, ferrite particles may be embedded in a resin mould filling a cavity between the U-shaped plates to form a core experiencing only low temperature stress.

The semiconductor device 100 may be an integrated circuit providing galvanic decoupling of signals, on-chip current measurements and/or power conversion, by way of example.

FIGS. 2A and 2B refer to an embodiment with a first coil structure 210 including the first winding 110 and a core structure that may or that may not include a core 118 in a first portion 191 and a second coil structure 220 including the second winding 120 and a core structure that may or that may not include a core 128 in a second portion 192. Intermediate portions without windings structurally connect the first and second coil structures 210, 220 to form a common coil structure 200. In a cross-section parallel to the main surface 101 both the first core structure 210 and the second coil structure 220 are approximately U-shaped. Each of the coil structures 210, 220 may include three linear portions, wherein two of the linear portions are parallel to each other and a third linear portion connects the two parallel portions. According to another embodiment, the coil structures 210, 220 may include further portions angled to the parallel portions and the connecting portion. The turns of the first and second windings 110, 120 may be formed in one, some, or all of the linear portions of the respective coil structure 210, 220.

Longitudinal axes of the two parallel portions of the first coil structure 210 coincide with two corresponding longitudinal axes 220 of two parallel portions of the second coil structure 220. The first and second coil structures form portions of the continuous common coil structure 200. The insulator frame 135 surrounding the first portion 191 of the semiconductor body 190 in the lateral directions includes two intermediate portions 230 of the common coil structure 200 between the first and the second core structures 210, 220. The intermediate portion 230 includes, e.g. portions of the coil insulator structures 111, 121 and the core insulator structures 115, 125, but does not include parts of the windings 112, 122.

In the vertical projection of the first portion 191, a portion of a contiguous dielectric structure 131a provided on the main surface 101 forms a first insulator plate 131. Further in the vertical projection of the first portion 191, a portion of a contiguous dielectric structure 132a provided on the rear surface 102 forms a rear side second insulator plate 132. The insulator frame 135, the first insulator plate 131, the second insulator plate 132 and the intermediate portions 230 form an insulator box 130 that completely surrounds the first coil 110. Beneath the intermediate portions 230, sections of the insulator frame 135 structurally connect the intermediate portions 230 and the second insulator plate 132.

The insulator frame 135 may include linear portions parallel to the linear portions of the core structure. Each intermediate portion 230 of the common coil structure 200 cuts into the upper portion of one of the linear portions of the insulator frame 135.

The insulator frame 135 extends from a main surface 101 into the semiconductor body 190. An extension in the vertical direction is equal to or greater than an extension of the first coil 110 including the corresponding coil insulator structures 111 in the vertical direction. The first coil 110 including the coil insulator structure 111 does not reach a rear surface 102 of the semiconductor body 190, which is opposite to the main surface 101. As regards the details of the first and second portions 191, 192, the first and second coils 110, 120 and the insulator frame 135, reference is made to the description of FIGS. 1A to 1B.

The coil insulator structures 111, 121 and the insulator frame 135 adjoin only in intersection areas where the insulator frame 135 intersects the longitudinal axes of the parallel portions of the coil structures 210, 220. Outside the intersection areas, the second portion 191 of the semiconductor body 190 may form an intermediate structure 140, which is formed between and separates the insulator frame 135 and the coil insulator structure 111 of the first coil 110. The intermediate structure 140 may include or consist of the semiconductor material of the semiconductor body 190. In addition, electronic devices like diodes, IGFETs (insulated gate field effect transistors) and/or logic circuits may be formed in the intermediate structure 140.

Figure 3A:
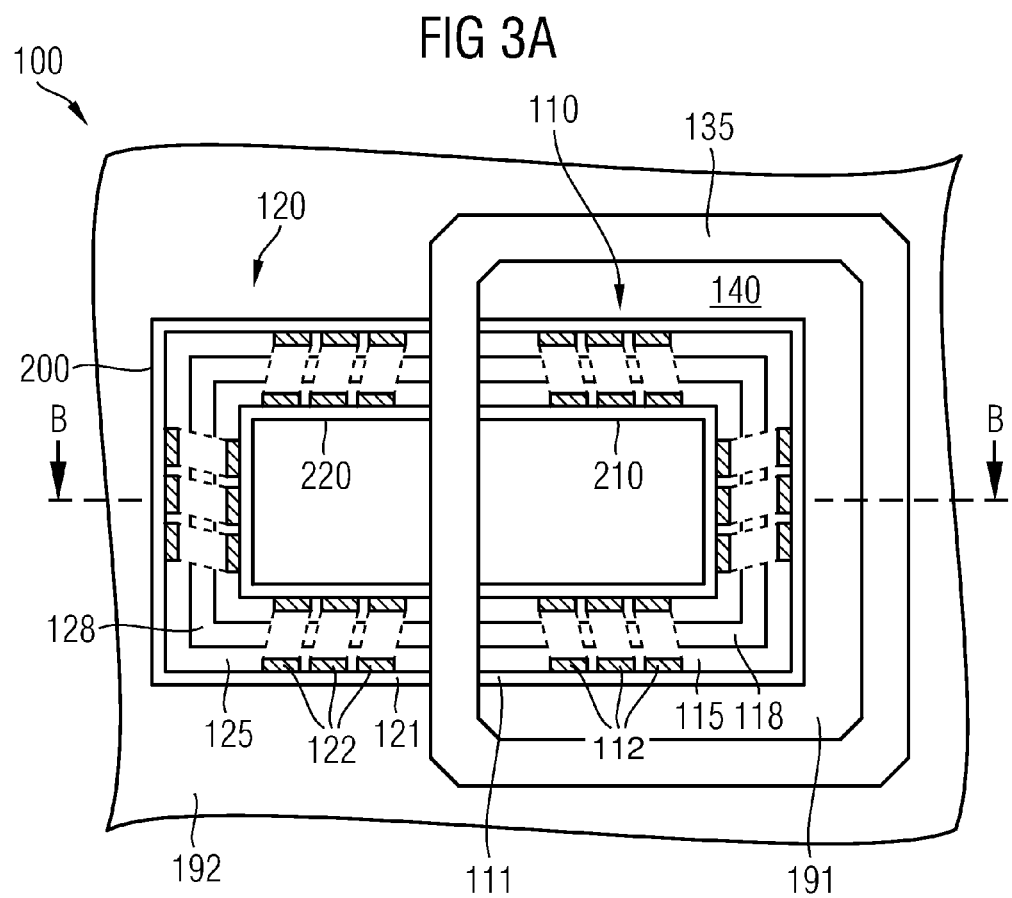
FIG. 3A is a schematic cross-sectional view parallel to a main surface of a portion of a semiconductor device, including two magnetically coupled coils in accordance with an embodiment providing a continuous insulator frame.
Figure 3B:
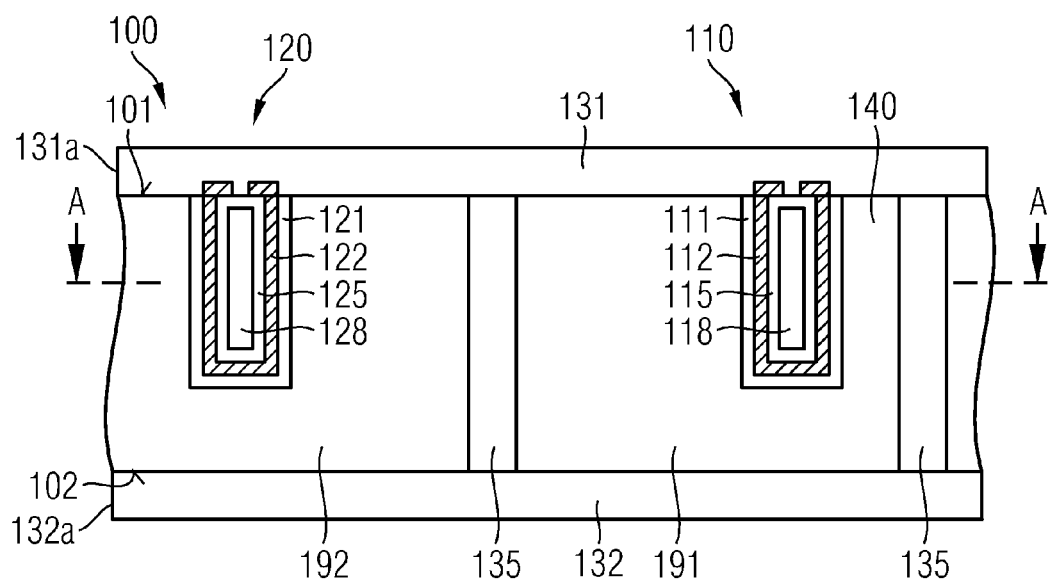
FIG. 3B is a further schematic cross-sectional view of the portion of the semiconductor device along line B-B in FIG. 3A.

FIGS. 3A to 3B refer to an embodiment with the insulator frame 135 separating two spatially separated coil structures 210, 220. The insulator frame 135 forms a closed loop and may have a rectangular form with linear portions parallel to linear portions of the coil structures 210, 220. In accordance with further embodiments, the insulator frame 135 may have further portions angled to the portions parallel to the linear portions of the coil structures 210, 220 and connecting the linear portions. As regards further details of the first and second coils 110, 120 and the insulator frame 135 reference is made to the description of FIGS. 1A, 1B and 2A, 2B.

Figure 4A:
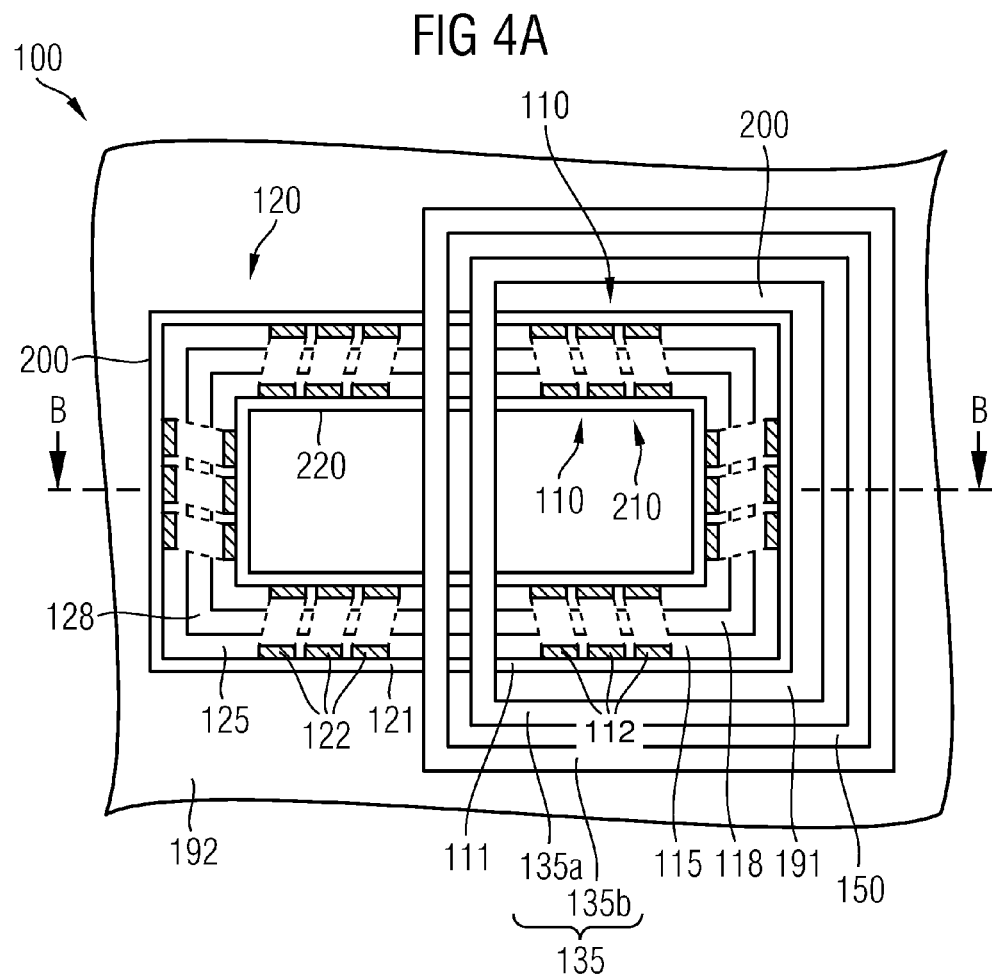
FIG. 4A is a schematic cross-sectional view parallel to a main surface of a semiconductor device in accordance with an embodiment providing an insulator frame with nested frame structures.
Figure 4B:
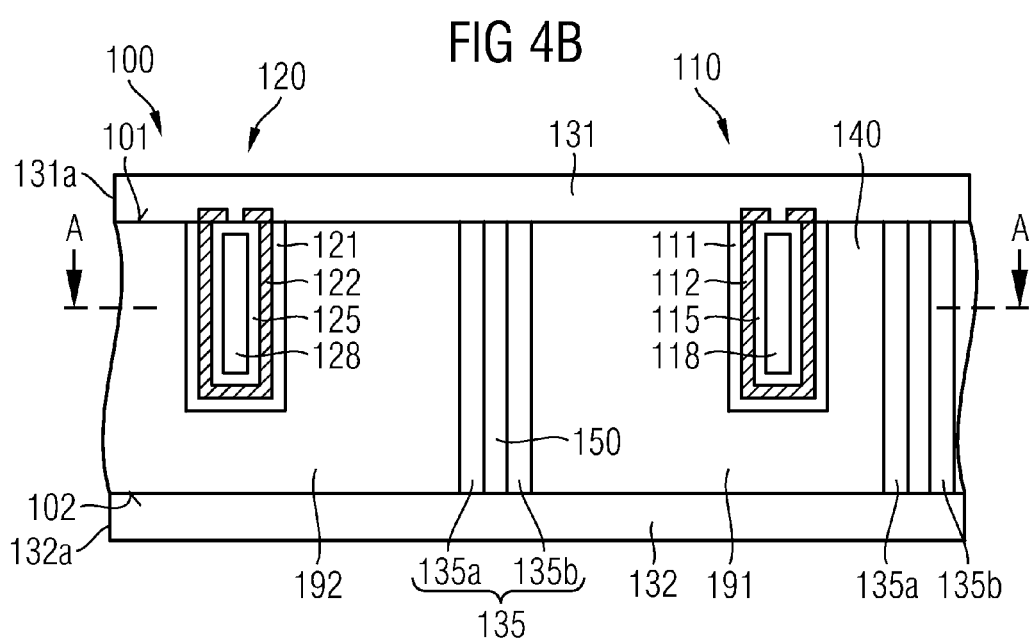
FIG. 4B is a further schematic cross-sectional view of the portion of the semiconductor device along line B-B in FIG. 4A.

FIGS. 4A and 4B show an insulator frame 135 including two nested frame structures 135a, 135b. The two nested frame structures 135a, 135b may be concentric and are separated by an intermediate frame structure 150 provided from a material different from the material of the nested frame structures 135a, 135b, for example from a semiconductor material forming the semiconductor body 190. Other embodiments may provide three or more nested frame structures 135a, 135b, . . . , wherein intermediate frame structures 150 separate each two directly neighboring nested frame structures 135a, 135b, . . . .

The nested frame structures 135a, 135b, . . . may be formed from deposited dielectric materials, for example silicon oxide deposited by CVD (chemical vapor deposition), and the intermediate frame structure 150 may be formed by a void or a material different from that of the nested frame structures 135a, 135b, . . . , e.g., the material of the semiconductor body 190. In accordance with another embodiment, the intermediate frame structure 150 includes a thermally grown silicon oxide resulting from thermal oxidation of a fin of the semiconductor material from which the semiconductor body 190 is formed, wherein the fin emerges from etching cavities for providing the nested frame structures 135a, 135b. The fin is oxidized before the cavities are filled with material(s) forming the insulator frame 135. The nested frame structures 135a, 135b may have different widths, different depths and may be provided from different material or material combinations. According to an embodiment, the nested frame structures 135a, 135b have approximately the same width and depth and consist of or include the same materials and material combinations and sub-layers.

The nested frame structures 135a, 135b may have linear portions extending parallel to linear portions of the coil structures 210, 220. In accordance with further embodiments, the nested frame structures 135a, 135b may have further portions angled to the portions parallel to the linear portions of the coil structures 210, 220. Neighboring nested frame structures may be equally spaced from each other. A distance between neighboring nested frame structures 135a, 135b, . . . may be uniform.

Figure 5A:
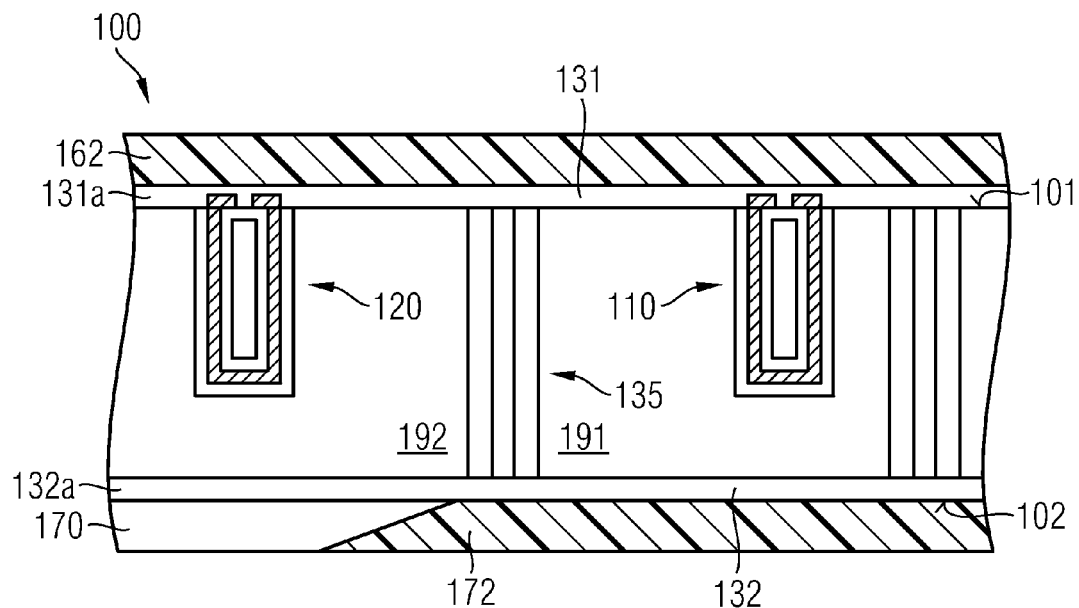
FIG. 5A is a schematic cross-sectional view of a portion of a semiconductor device including a monolithic integrated transformer related to an SOI substrate.

FIG. 5A shows an embodiment providing a front side first insulator plate 131, which extends over an area assigned to the first portion 191 of the semiconductor body 190 at a first side of the first coil 110 oriented to the main surface 101 of the semiconductor body 190. The first insulator plate 131 is a portion of a contiguous dielectric structure 131a provided on the main surface 101 and extending over the second portion 192 of the semiconductor body 190. The first insulator plate 131 is structurally connected with the insulator frame 135. The dielectric structure 131a may include one or more dielectric layers and may also embed conductive structures, for example wiring lines. The dielectric structure 131a may include a passivation layer from silicon oxide, silicon nitride or silicon oxynitride. A stress relief layer 162 may be provided in contact with the dielectric structure 131a. The stress relief layer 162 may be a dielectric polymer and may contain or consist of polyimide, benzocyclobutene, polynorbornene, polystyrene, polycarbonate, or parylene with or without additives, or a mixture of two or more of these polymers.

A second insulator plate 132 extends over the area assigned to the first portion 191 of the semiconductor body 190 at the second side of the first coil 110, wherein the second side is opposite to the first side. According to the illustrated embodiment, the second insulator plate 132 is structurally connected with the insulator frame 135. The second insulator plate 132 may be a portion of a contiguous insulator layer forming part of a silicon-on-insulator (SOI) substrate on which the semiconductor body 190 is bonded. The contiguous insulator layer 132a separates the semiconductor body 190 and a semiconductor layer 170, which is at least formed opposite to the second portions 192 of the semiconductor body 190.

According to the embodiment illustrated in FIG. 5A, the semiconductor layer 170 is exclusively formed in regions directly facing the second portion 192 at the opposite side of the contiguous insulator layer 132a. A rear side insulator structure 172, e.g. a dielectric polymer structure or a combination of thermal oxides and dielectric polymers, is formed in a region opposite to the first portion 191 of the semiconductor body 190 at the contiguous insulator layer 132a to further increase the dielectric strength.

Figure 5B:
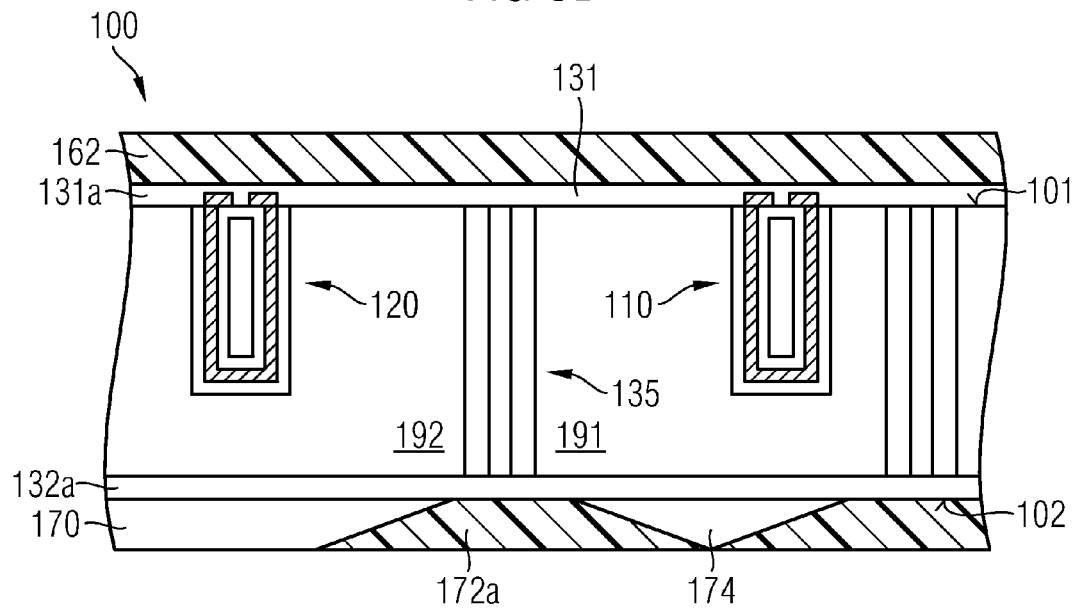
FIG. 5B is a schematic cross-sectional view of a portion of a semiconductor device including a monolithic integrated transformer in accordance with an embodiment providing an enforcement structure.

According to FIG. 5B a rear side insulator frame 172a is provided in regions of the semiconductor layer 170 corresponding to the insulator frame 135 in a region opposite to the insulator frame 135. The rear side insulator frame 172a encloses an enforcement portion 174 of the semiconductor layer 170, the enforcement portion 174 increasing the mechanical stability of the semiconductor device 100.

Figure 5C:
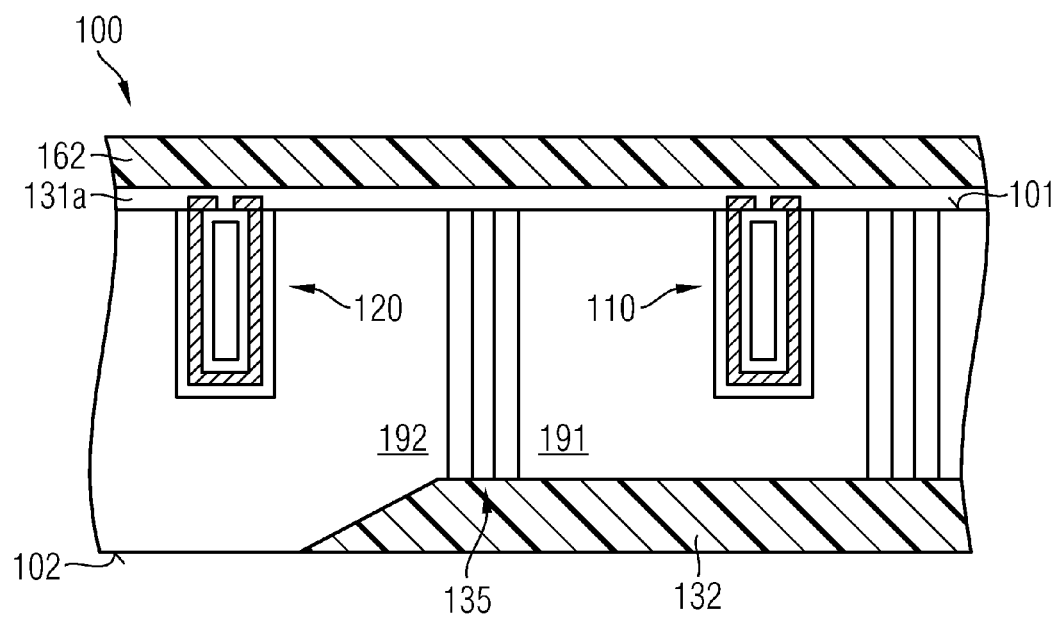
FIG. 5C is a schematic cross-sectional view of a portion of a semiconductor device including a monolithic integrated transformer in accordance with an embodiment related to a silicon substrate.

FIG. 5C refers to an embodiment with the second insulator plate 132 extending from a rear surface 102, which is opposite to the main surface 101, into the semiconductor body 190 in a region corresponding to the first portion 191 and the insulator frame 135. The second insulator plate 132 may be formed from a dielectric polymer or a combination of thermal oxides and dielectric polymers, for example one of the dielectric polymers mentioned above.

Figure 5D:
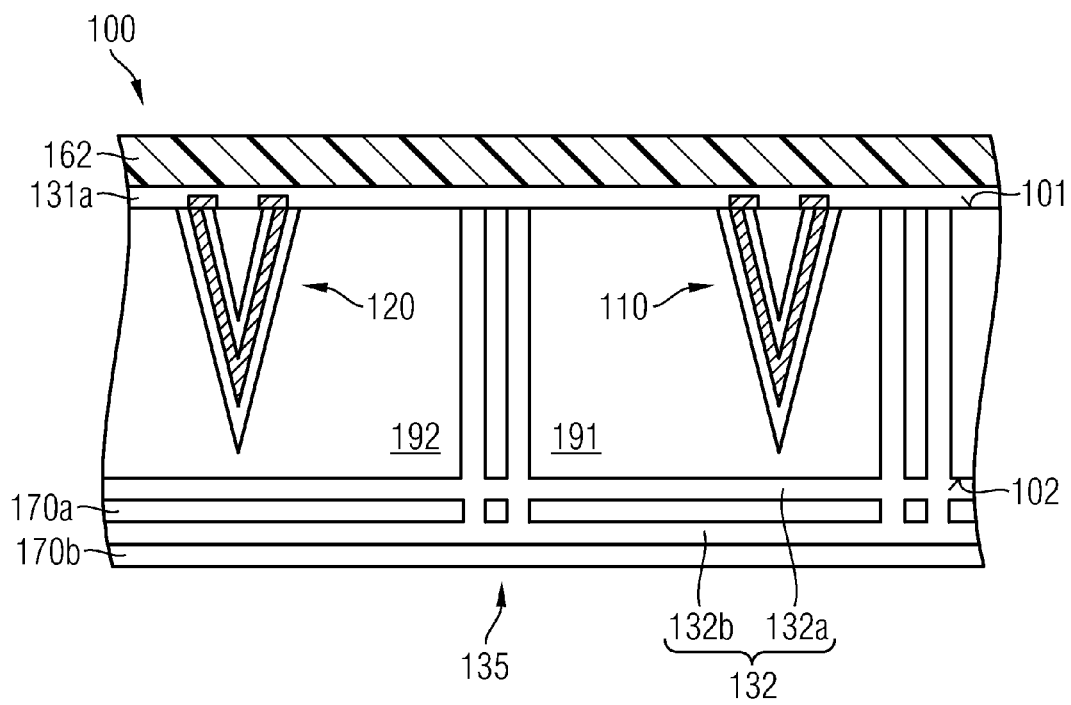
FIG. 5D is a schematic cross-sectional view of a portion of a semiconductor device including a monolithic integrated transformer in accordance with an embodiment related to multiple SOI substrates.

FIG. 5D provides a further contiguous insulator layer 132b in a distance to a first contiguous insulator layer 132a, wherein an intermediate semiconductor layer separates the two contiguous insulator layers 132a, 132b. In the first portion 191, the two contiguous insulator layers 132a, 132b form the second insulator plate 132. Other embodiments may provide further contiguous insulator layers in a distance to each other, wherein each pair of neighboring contiguous insulator layers 132a, 132b, . . . is separated by intermediate semiconductor layers 170a, 170b, . . . . The semiconductor device 100 of FIG. 5D may be manufactured on the basis of multiple SOI substrates bonded to each other and to a semiconductor substrate including the semiconductor body 190.

One or more further transformers may be provided in the same semiconductor portion, e.g., in a nested manner. The transformers may be connected in series or may provide independent and electrically separated channels, wherein both the primary and the secondary windings are provided in the same semiconductor portion.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a first coil monolithically integrated in a first portion of a semiconductor body and including a first winding;
a second coil monolithically integrated in a second portion of the semiconductor body and including a second winding, the first and second coils being magnetically coupled with and dielectrically insulated from each other, the first and second portions being arranged side by side in a lateral direction parallel to a main surface of the semiconductor body; and
an insulator frame formed in the semiconductor body, surrounding the first portion in the lateral direction and excluding the second portion.

2. The semiconductor device of claim 1, comprising:
a first core structure wrapped around by the first winding, and
a second core structure wrapped around by the second winding.

3. The semiconductor device of claim 2, wherein at least one of the first and second core structures includes a ferromagnetic or ferrimagnetic core.

4. The semiconductor device of claim 2, wherein each of the core structures is U-shaped in a cross-section parallel to the main surface.

5. The semiconductor device of claim 2, wherein a longitudinal axis of a portion of the first core structure coincides with a longitudinal axis of a portion of the second core structure.

6. The semiconductor device of claim 2, wherein two longitudinal axes of two parallel portions of the first core structure coincide with two longitudinal axes of two parallel portions of the second core structure.

7. The semiconductor device of claim 2, wherein the first and second core structures form portions of a continuous common core structure.

8. The semiconductor device of claim 7, wherein the insulator frame comprises at least one intermediate portion of the continuous common core structure between the first and second core structures.

9. The semiconductor device of claim 2, wherein the insulator frame comprises a section intersecting longitudinal axes of the first and second core structures.

10. The semiconductor device of claim 1, wherein the insulator frame extends from a main surface into the semiconductor body up to a distance to the main surface which is equal to or greater than an extension of the coils in a direction perpendicular to the main surface.

11. The semiconductor device of claim 1, wherein each of the first and second coils includes a coil insulator structure between the winding and the semiconductor body.

12. The semiconductor device of claim 11, wherein the coil insulator structures line cavities extending from the main surface into the semiconductor body, the cavities further containing the coils.

13. The semiconductor device of claim 11, wherein:
the coil insulator structures and the insulator frame intersect each other and are in contact with each other in at least one intersection area; and,
outside the at least one intersection area an intermediate structure provided from a material different from the insulator frame separates the coil insulator structure of the first coil and the insulator frame.

14. The semiconductor device of claim 13, wherein the intermediate structure is provided from a semiconductor material.

15. The semiconductor device of claim 1, wherein the insulator frame comprises one single insulator frame structure.

16. The semiconductor device of claim 1, wherein the insulator frame comprises two or more nested frame structures, each two neighboring nested frame structures separated by an intermediate frame structure provided from a material different from the nested frame structures.

17. The semiconductor device of claim 16, wherein neighboring nested frame structures are equally spaced from each other.

18. The semiconductor device of claim 16, wherein a distance between neighboring nested frame structures is uniform.

19. The semiconductor device of claim 1, comprising: a first insulator plate extending over an area assigned to the first portion at a first side of the first coil, the first side oriented to the main surface.

20. The semiconductor device of claim 19, wherein the first insulator plate is structurally connected with the insulator frame.

21. The semiconductor device of claim 1, comprising: a second insulator plate extending over an area assigned to the first portion at a second side of the first coil, the second side being opposite to the first side.

22. The semiconductor device of claim 21, wherein the second insulator plate is structurally connected with the insulator frame.

23. The semiconductor device of claim 21, wherein the second insulator plate is a portion of a contiguous insulator layer extending over the first and second portions.

24. The semiconductor device of claim 23, wherein the contiguous insulator layer separates the semiconductor body and a semiconductor layer.

25. The semiconductor device of claim 24, wherein the semiconductor layer comprises a rear side insulator structure in a region opposite to the first portion.

26. The semiconductor device of claim 23, wherein the contiguous insulator layer separates the semiconductor body and a semiconductor layer, the semiconductor layer comprising a rear side insulator frame running in a region opposite to the insulator frame and enclosing an enforcement portion of the semiconductor layer.

27. The semiconductor device of claim 23, comprising: at least one further continuous insulator layer in a distance to the continuous insulator layer, neighboring continuous insulator layers being separated by intermediate semiconductor layers.

* * * * *